(12) United States Patent
Mithal et al.

(10) Patent No.: US 7,716,608 B2
(45) Date of Patent: May 11, 2010

(54) CIRCUIT SYNTHESIS WITH SEQUENTIAL RULES

(75) Inventors: Arvind Mithal, Arlington, MA (US); Daniel L. Rosenband, San Mateo, CA (US)

(73) Assignee: Massachusetts Institute of Technology, Cambridge, MA (US)

( * ) Notice: Subject to any disclaimer, the term of this patent is extended or adjusted under 35 U.S.C. 154(b) by 185 days.

(21) Appl. No.: 11/421,612

(22) Filed: Jun. 1, 2006

(65) Prior Publication Data

US 2006/0277021 A1 Dec. 7, 2006

Related U.S. Application Data

(60) Provisional application No. 60/686,193, filed on Jun. 1, 2005.

(51) Int. Cl.
G06F 17/50 (2006.01)
(52) U.S. Cl. .......................................................... 716/1
(58) Field of Classification Search ................. 716/1–18
See application file for complete search history.

(56) References Cited

U.S. PATENT DOCUMENTS

| | | | |
|---|---|---|---|
| 5,541,850 A | 7/1996 | Vander Zanden et al. | |
| 5,905,664 A | 5/1999 | Ko et al. | |
| 5,912,678 A | 6/1999 | Saxena et al. | |
| 6,099,577 A | 8/2000 | Isobe | |
| 6,216,260 B1 | 4/2001 | Neyfakh | |
| 6,275,973 B1 | 8/2001 | Wein | |
| 6,578,187 B2 | 6/2003 | Yasuda | |
| 6,597,664 B1 | 7/2003 | Mithal | |
| 6,901,055 B1 * | 5/2005 | Hoe et al. | 370/252 |

FOREIGN PATENT DOCUMENTS

| | | |
|---|---|---|
| EP | 0329233 | 8/1989 |
| EP | 0829812 | 3/1998 |

OTHER PUBLICATIONS

Subrahmanyam et al., Automated Synthesis of Mixed-Mode (Asynchronous and Synchronous) Systems AT&T Technical Journal (Jan. 1991).
Arvind et al., "Using Term Rewriting Systems to Design and Verify Processors", IEEE Micro Special Issue, May/Jun. 1999.
Babb et al., "Parallelizing Applications into Silicon", MIT Laboratory of Computer Science, Apr. 1999.
Cook et al., "Formal verification of explicitly parallel microprocessors", Mar. 5, 1999.

(Continued)

*Primary Examiner*—Vuthe Siek
*Assistant Examiner*—Aric Lin
(74) *Attorney, Agent, or Firm*—Occhiuti Rohlicek & Tsao LLP

(57) ABSTRACT

A scheduling approach enables scheduling sequential execution of rules in a single cycle of a synchronous system without necessarily requiring explicit implementation of a composite rule for each sequence of rules than may be composed. One method for designing a synchronous digital system includes using modules with multiple successive interfaces such that within the a single clocked cycle, each module performs a function equivalent to completing interactions through one of its interfaces before performing interactions through any succeeding one of its interfaces. The scheduled state transition rules are associated with corresponding interfaces of the modules.

28 Claims, 8 Drawing Sheets

OTHER PUBLICATIONS

Gupta et al., "Hardware-software Co-synthesis for Digital Systems", Computer Science Laboratory, Stanford University, 1993.

Liao et al., "An Efficient Implementation of Reactivity for Modeling Hardware in the Scenic Design Environment", University of California at Irvine, 1997.

Matthews et al., "Microprocessor Specification in Hawk", 1998.

Windley, P., "Specifying Instruction-Set Architectures in HOL: A Primer", Brigham Young University, 1994.

Windley, P., "Verifying Pipelined Microprocessors", Brigham Young University, 1995.

* cited by examiner

CIRCUIT SYNTHESIS WITH SEQUENTIAL RULES

CROSS-REFERENCE TO RELATED APPLICATIONS

This application claims the benefit of U.S. Provisional Application No. 60/686,193, filed on Jun. 1, 2005, which is incorporated herein by reference.

This application is related to U.S. Pat. No. 6,901,055, "SYNCHRONOUS CIRCUIT SYNTHESIS USING AN ASYNCHRONOUS SPECIFICATION," issued on May 31, 2005, which is incorporated herein by reference.

BACKGROUND

This invention relates to circuit synthesis with sequential rules.

An approach to circuit synthesis makes use of an asynchronous system specification to produces a detailed hardware description for a synchronous system, in particular, a clocked digital circuit that functions according to the asynchronous system specification. That is, any sequence of states traversed at clock times of the clocked digital circuit is guaranteed to be a sequence (or subsequence) of states that may be traversed by the asynchronous system. A compiler can be used to accept the asynchronous system specification and automatically produce a corresponding synchronous circuit specification, for example, specified using the Verilog hardware description language (HDL). One such compiler that performs this task makes use of a Term Rewriting System (TRS) to specify the asynchronous system.

The TRS specification accepted by the compiler includes a set of rules, which are also referred to as guarded atomic actions. Each rule consists of a body and a guard. The body describes the execution behavior of the rule if it is enabled. That is, the body characterizes the change in the state of the system on application of the rule, where the state is define by the values of storage elements of the system, such as registers or FIFOs. The guard (or predicate) of a rule specifies the condition that needs to be satisfied for the rule to be executable. A rule $R_i$ is written as $$\text{rule } R_i: \text{ when } \pi_i(s) \Rightarrow s := \delta_i(s)$$

where $\pi_i(s)$ represents the guard and $s := \delta_i(s)$ represents the body of rule $R_i$.

One synthesis (i.e., compilation) approach generates combinational logic for each rule's predicate ($\pi$) and each rule's state update function ($\delta$). For each clock cycle of the synchronous system, a scheduler chooses one of the rules whose predicate is true (i.e., a rule that is "executable" or "enabled") and updates the state with the result of the corresponding update function ($\delta$). This process repeats in every clock cycle.

Given any two rules $R_a$ and $R_b$, a designer can specify a composite rule for the asynchronous specification that specifies that $R_b$ executes after $R_a$ as follows:

$$\text{rule } R_{ab}: \text{ when } (\pi_a(s) \& \pi_b(\delta_a(s))) \Rightarrow s := \delta_b(\delta_a(s))$$

Because the original two rules are already in the system, such a composite rule can be added to the asynchronous system specification without introducing new illegal behavior. Addition of certain composite rules can enable more rules to be scheduled by the compiler to execute in a single cycle. However, each additional composite rule generally increases the amount of synthesized circuitry, such that addition of all or many possible composite rules can be combinatorially prohibitive. Also, introduction of certain composite rules can reduce achievable clocking rates by introducing long chains of combinational logic in the circuit synthesized by the compiler.

Source-to-source TRS transformation systems have been proposed in which new composed rules are added to a system. In one such approach, the new rules are produced by taking a cross product of all the rules in a system and filtered out those composite rules that are "uninteresting" in the following sense. For example, composition of $R_1$ followed by $R_2$ may be considered uninteresting if either $R_2$ could not be enabled after $R_1$ executed or if $R_1$ and $R_2$ could already be scheduled in a single cycle.

SUMMARY

In one aspect, in general, a scheduling algorithm enables scheduling of composite rules in a single cycle without necessarily requiring explicit implementation of a composite rule for each sequence of rules than may be composed.

In another aspect, a method for designing a synchronous digital system includes scheduling state transition rules for application, if enabled, in a single clocked cycle of the synchronous digital system to achieve a result equivalent to application of the rules in a predetermined order. Modules with multiple successive interfaces are specified such that within the a single clocked cycle, each module performs a function equivalent to completing interactions through one of its interfaces before performing interactions through any succeeding one of its interfaces. The scheduled state transition rules are associated with corresponding interfaces of the modules.

Aspects can include one or more of the following features.

Scheduling the state transition rules includes identifying an ordering of the state transition rules. For example, identifying the ordering includes identifying a sequence of sets of rules, and the predetermined order is such that any rule in one of the sets is applied prior to application of rules in the subsequent sets of rules in the sequence.

Specifying the modules includes processing a specification of a first module that has a single interface to a first function to form a specification of a second module having multiple successive interfaces. The function of the second module is equivalent to completing the first function via one of its interfaces before performing the first function through any succeeding ones of its interfaces.

Processing the specification of the first module includes recursively processing specifications of sub-modules of the first module to form specifications of sub-modules having multiple successive interfaces.

The first module is a register.

The second module with multiple successive interfaces is an ephemeral history register (EHR).

Associating the state transition rules with corresponding interfaces, includes for each state transition rule associating that rule with one interface of each module.

The modules with multiple successive interfaces are optimized, for example, by removing interfaces that are not used by any rules.

In another aspect, in general, a method for designing a synchronous digital system according to an asynchronous system specification for a system makes use of an asynchronous system specification. This specification includes specifications of a set of state transition rules, each rule defining access to one or more storage elements of the system. A sequence of the state transition rules is identified for potential execution in a single cycle of the synchronous digital system. The asynchronous system specification and the specification of the sequence of rules are processed to form a specification of the synchronous digital system. The specified synchronous digital system includes at least one storage element that provides multiple versions of interfaces, each version of the interfaces being associated with a different one of the sequence of state transition rules.

Aspects can include one or more of the following features.

The different versions of the interfaces are such that for a first version and a second version of the interfaces, states transitions associated with inputs at the first version of the interfaces affect outputs at the second version of the interfaces during a single cycle, and inputs at the second version of the interfaces do not affect outputs at the first version of the interfaces during a single cycle.

The storage element can be a register, or a first-in-first-out storage element.

In another aspect, in general, a synchronous digital system is designed according to an asynchronous system specification, which includes specifications of a set of state transition rules, each rule defining access to one or more storage elements of the system. A sequence of the state transition rules is identified for potential execution in a single cycle of the synchronous digital system. The asynchronous system specification and the specification of the sequence of rules are processed to form a specification of the synchronous digital system. The specified synchronous digital system enables asynchronous application of the series of state transition rules within a single cycle of the synchronous digital system.

Aspects can include one or more of the following features.

Processing the asynchronous system specification and the specification of the sequence of rules includes associating different of said rules with different asynchronous sub-cycles of a cycle of the synchronous digital system.

In another aspect, in general, a synchronous digital system includes a module that includes an ordered set of multiple versions of an interface. The versions of the interface are associated with ordered processing phases of a clock cycle of the synchronous system. The system includes circuitry for performing each of a set of actions. Each action includes an interaction with the module using a corresponding different one of the set of multiple versions of the interface. The module is configured to perform the set of actions in one clocked cycle such that the combined function is equivalent to sequential performance of the actions according to the ordering of the corresponding versions of the interface.

In another aspect, in general, a synchronous digital system includes a set of storage elements, each storage element providing a set of interfaces for accessing or modifying a state of the storage element. At least a first of the storage elements includes multiple versions of interfaces, each version including some or all of the set of interfaces, and the versions of the interfaces being associated with sequential processing phases.

Aspects can include one or more of the following features.

The versions of the interfaces for the first of the storage elements is such that for a first version and a second version of the versions of the interfaces, states transitions associated with inputs at the first version of the interfaces affect outputs at the second version of the interfaces during a single cycle of the synchronous digital system, and inputs at the second version of the interfaces do not affect outputs at the first version of the interfaces during a single cycle.

The first of the storage elements is a first-in-first-out (FIFO) storage element, and the multiple versions of interfaces of the element enables a value that is enqueued to the FIFO storage element using one version of the interfaces in a cycle of the synchronous digital system to be accessed in the same cycle through a different version of the interfaces.

The first of the storage elements is implemented using asynchronous logic without requiring synchronous processing at a higher rate than that of the synchronous digital system.

Aspects can have one or more of the following advantages.

A solution to the technical problem of implementing multiple conflicting state updating rules in a single clocking cycle can be provided. The solution can have the advantage of incurring substantially less cost in efficiency (circuit area and/or clocking period) as compared to enumeration of all desired compositions prior to circuit synthesis.

A higher degree of parallel execution of rules can be enabled that using other rule scheduling approaches.

Other features and advantages of the invention are apparent from the following description, and from the claims.

DESCRIPTION

Figure 1A:
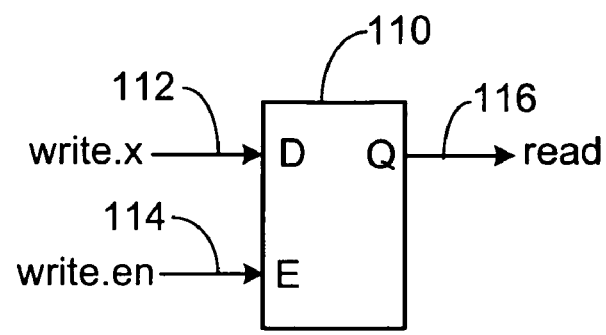
FIG. 1A is a register.

Rule-based hardware synthesis has been successful in providing a designer with a methodology and a synthesis tool (e.g., a compiler) that can help eliminate functional bugs, for example, that are related to complicated race conditions in designs. Such a synthesis approach can provide a simple model with which the designer can reason about the correctness of his/her design. The rule-based synthesis model provides that all legal behaviors can be explained in terms of some sequential and atomic firing of rules on the state elements. A synthesis tool based on this approach has demonstrated that an RTL (register transfer language) hardware specification that is comparable in quality (e.g., in area and time) to hand-coded Verilog can be generated in this way.

In general, it is desirable that the synthesized synchronous circuit executes as many rules as possible in each clock cycle to increase the average rate of rule execution per clocking period. However, it is also desirable to increase this rate (average number of rules executed per cycle) without incurring a substantial increase in the amount of circuitry required to implement the system or a substantial increase in the minimum clock period required to guarantee that signals will propagate through all paths of combination logic in the clock period.

Independent of, or in addition to, any source-to-source transformations that augment the set of rules specifying the asynchronous system, approaches to addressing the technical goal of increasing the number of rules executed per clocking cycle generally include:

scheduling multiple rules in a single cycle that do not conflict in their access to storage elements of the state ("conflict free" rules);

scheduling multiple rules in a single cycle if their concurrent execution can be implemented to be equivalent to sequential atomic execution of those multiple rules ("sequentially composable" rules); and scheduling a sequences of multiple rules (or any subset in sequence) effectively in a series of asynchronous (i.e., unclocked) phases of a single clock cycle of the synchronous system.

Scheduling multiple rules for execution in a single clock cycle includes specifying components of the synchronous system (e.g., control logic) that permits execution of the rules, if they are enabled, in a single clock cycle. That is, the scheduling includes activities that are performed at design time for the synchronous system. The actual enabling of specific rules at execution time depends on the state of the system at that time and the components of the system specified in the design time scheduling.

The first two approaches are described in U.S. Pat. No. 6,901,055, "SYNCHRONOUS CIRCUIT SYNTHESIS USING AN ASYNCHRONOUS SPECIFICATION," which is incorporated herein by reference. The third approach is described fully below. Note that both the sequential composition approach and the third approach described below enables identification of a sequence of rules at design time such that the synthesized circuit may effectively execute the sequence of rules (or a subset in sequence) at execution time without requiring explicit introduction into the specification of the asynchronous system of an explicit composition of the rules in the sequence, or enumeration of the subsets of the sequence that can be executed together if enabled.

One example of the third approach to scheduling makes use of a new type of hardware element, which is referred to herein as an "Ephemeral History Register" (EHR). As discussed further below, an EHR can be used in place of an ordinary storage register to implement scheduling constraints in rule-based synthesis of a sequence of rules. An EHR can help enable execution of a sequence of conflicting (or potentially but not actually conflicting) rules in a single clock cycle, for example, implementing forwarding of values determined in one rule to follow-on rules which can be scheduled for execution in the same clock cycle as the forwarded values were determined.

In one example a rule-based specification uses a term rewriting system (TRS) specification. The TRS specification of an asynchronous system can be used for synthesizing a clocked system, such as a clocked integrated circuit. The TRS specification includes a set of guarded atomic actions (also referred to as rules), each of which consists of a body and a guard. The body of a rule describes the execution behavior (action) of the rule if it is enabled. The guard (also referred to as a predicate) specifies the condition that needs to be satisfied for the rule to be executable. A rule is written in the form:

rule $R_i$: when $\pi_i(s)$ ==> $s:=\delta_i(s)$

Here, $\pi_i$ is the predicate and $s:=\delta_i(s)$ is a reassignment of the state s that forms the body of rule $R_i$. The function $\delta_i$ computes the next state of the system from the current state s. The execution model for a set of such rules is to non-deterministically pick a rule whose predicate is true and then to atomically execute that rule's body. The execution continues as long as some predicate is true:

while (some $\pi$ is true) do (1) select any $R_i$, such that $\pi_i(s)$ is true (2) $s:=\delta_i(s)$ A baseline synchronous circuit synthesis approach implements the execution model by generating combinational logic for each rule's predicate ($\pi$) and each rule's state update function ($\delta$). The compiler also generates logic for a scheduler to implement the function of choosing on each clock cycle one of the rules whose predicate is true and updating the state with the result of the corresponding update function ($\delta$).

U.S. Pat. No. 6,901,055 describes additional scheduling approaches, introduced above, in addition to the baseline above. Such additional scheduling approaches do not introduce any new behaviors not already allowed by the asynchronous system specification. One type of scheduling is based on Conflict Free (CF) analysis of rules. Two rules $R_1$ and $R_2$ are CF if they do not read or write common storage elements of the state. In this case, whenever both rules enabled at the start of a clock cycle, both rules can execute simultaneously (i.e., can be scheduled in a single clock cycle) and their execution can be explained as the execution of $R_1$ followed by $R_2$ or vice versa. Another type of scheduling is based on a Sequential Composition analysis of rules. Two rules $R_1$ and $R_2$ are Sequentially Composable (SC) if $R_1$ does not write any element that $R_2$ reads. A synthesis procedure for SC rules can generate logic that, when both rules are enabled at the start of a clock cycle, can ignore the updates of $R_1$ on those elements which are also updated by $R_2$ and thereby generates a circuit that behaves as if $R_1$ executed before $R_2$. An aspect of synthesis of CF and SC rules is that, beyond a possible multiplexer at the input to registers, concurrent scheduling of CF and SC rules does not generally increase the combinational logic path lengths and hence does not increase the minimum clock cycle time of a circuit design.

In many designs aggressive CF and SC analysis is sufficient to uncover all, or at least a desirable amount of, concurrency in rule scheduling. However, there are situations, for example, when the designer wants to schedule a follow-on rule that may be affected (even enabled) by a previous rule scheduled in the same cycle. Bypassing, or value forwarding, is an example of such situations: a rule, if it fires, produces a value that updates the state by a value being written to a register and the follow-on rule may want to use in the same cycle the value is to be stored in the register. Capturing this type of behavior (i.e., scheduling both such rules in a single cycle) is generally beyond CF and SC analysis.

A fundamental property of TRSs is that if a new rule is added to a set of rules, adding the rule can enable new behaviors (i.e., state sequences) but cannot disallow any of the old behaviors enabled by the existing set of rules. Furthermore, if the new rule being added is a so called "derived rule" (e.g., a composition of existing rules) then it does not add any new behaviors. Given two rules $R_a$ and $R_b$ we can generate a composite rule that does $R_b$ after $R_a$ as follows:

$R_{a,b}$: when $(\pi_a(s) \& \pi_b(\delta_a(s)))$ ==> $s:=\delta_b(\delta_a(s))$ An example of constructing the composed terms $\pi_b(\delta_a(s))$ and $\delta_b(\delta_a(s))$ when registers (x and y) are the only state-elements is illustrated by the following two rules that describe Euclid's GCD algorithm, which computes the greatest common divisor of two numbers by repeated subtraction:

$R_{sub}$: when $((x>y) \& (y!=0))$ ==> $x:=x-y$;

$R_{swap}$: when $((x<=y) \& (y!=0))$ ==> $x, y:=y, x$;

Given these two rules, we can derive a new $R_{swap, sub}$ rule that immediately performs a subtraction after a swap. We name the values written by $R_{swap}$, as $x_{swap}'$, and $y_{swap}'$:

let $x_{swap}'=y$; $y_{swap}'=x$ $R_{swap,sub}$: when $((x<=y) \& (y!=0) \& (x_{swap}'>y_{swap}') \& (y_{swap}'!=0))$ ==> $x, y:=x_{swap}'-y_{swap}', y_{swap}'$;

After substitution this rule is equal to the following rule:

$R_{swap,sub}$: when $((x<=y) \& (y!=0) \& (y>x) \& (x!=0))$ ==> $x, y:=y-x, x$;

Since the $R_{swap,sub}$ rule was formed by composition of existing rules it can safely be added to the GCD system specification. We can then generate a synchronous circuit for the three rules: $R_{sub}$, $R_{swap}$ and $R_{swap,sub}$ using CF and SC analysis, giving preference to the $R_{swap,sub}$ rule when it is applicable. This circuit performs better than the original rule system which only contained $R_{sub}$ and $R_{swap}$ since it allows both the swap and subtraction to occur within a single cycle.

An alternative method for specification of rules for synthesis as a clocked circuit relates to rule composition, but does not explicitly involve introduction of composite rules into the asynchronous specification. The approach makes use of conditional actions in rule generation and avoids the explosion in the number of new rules generated that is associated with enumeration of rule compositions. Conditional actions permit combination of a number of unconditional rules into one conditional rule. Such a combination rule can admit a more efficient implementation than would generally be achieved using equivalent multiple explicit compositions of unconditional rules. A conditional action, such as "if q then a", executes action a only if condition q is true. The simplest form of action a is an assignment of a value to a register.

In addition to storage elements such as registers, the synthesis approach can make use of more complex "modules." A module can contain local state (i.e., instances of primitive modules such as registers), local rules, and interface methods that can be called by other modules. Note that a register itself is an example of a module with a relatively simple interface. Methods, like rules, contain a body that can access primitive state elements and/or call methods of other modules. Each method may also contains a guard that indicates to the caller that this method should not be invoked unless the guard is true. For example, the dequeue method in a FIFO has a guard to indicate that the FIFO is not empty. Scheduling annotations are used by the compiler to generate scheduling logic without necessarily using the details of the implementation of the module. For example, such annotations are used to describe the effect of an action method (g1) on the other read and action methods (g2) of the same module. If two methods are mutually exclusive (ME) they cannot affect each other since they will never be called simultaneously. We also assume that the methods of two different modules do not affect each other. Annotations (a) can specify if g1 and g2 can be called from a single rule; (b) can specify that if g1 and g2 are called from different rules whether they can be scheduled in parallel, and if so, whether any ordering is imposed on those rules; and (c) can specify whether g1 can be called from two different rules simultaneously. In this approach to annotation, the same action method is not permitted to be called more than once from a single rule. Read methods on the other hand, because they do not interfere with each other, can be called multiple times from within a rule. Action method calls of modules may have implicit conditions, which can affect (e.g. disable) the firing of the rule calling the method.

The body of rules, including actions in the body of conditional rules, can be represented by a sequence of one or more action method calls of modules. Consider the following rule where $a_1$ and $a_2$ represent actions:

$R$: when $p \Rightarrow a_1$; if q then $a_2$

This rule can be understood as the union of the following two mutually exclusive rules that do not use conditional actions:

$R_1$: when p & q $\Rightarrow a_1$; $a_2$ $R_2$: when p & !q $\Rightarrow a_1$ (Note that this transformation is always correct but may cause some subtle effects in a modular compilation flow when actions have implicit conditions. For example, one gets slightly different semantics depending on if the implicit conditions of $a_2$ are conjoined to just $R_1$ or both $R_1$ and $R_2$.)

Using conditional actions we can generate a composite conditional rule that conditionally executes $R_b$ after $R_a$ as follows:

$R_{a,b}$: when (True)=>$t_a$=if $\pi_a(s)$ then $\delta_a(s)$ else $s$; $t_b$=if $\pi_b(t_a)$ then $\delta_b(t_a)$ else $t_a$; $s := t_b$ In the above rule specification, s contains state elements and $t_a$, $t_b$, should be read as temporary local variables (not registers) whose values are visible only within the rule and not maintained across clock cycles. This new rule has the advantage that it behaves as rule $R_a$ if rule $R_b$ does not get enabled; behaves as rule $R_b$ if rule $R_a$ is not enabled and behaves as $R_a$ followed by $R_b$ if $R_a$ is enabled and that in turn enables $R_b$.

Using this method, the composition of the swap with sub rule in GCD can be written using conditional actions as follows:

$R_{swap,sub}$': when (True)=> if $(x<=y)$ & $(y!=0)$ then $t_x=y$, $t_x=x$;

if $(tx>t_y)$ & $(t_y!=0)$) then $t_x'=t_x-t_y$, $t_y'=t_y$;

$x:=t_x'$, $y=t_y'$

The difference between $R_{swap,sub}$ and $R_{swap,sub}$' given earlier is that this rule subsumes the functionality of the two rules which were used to compose it.

A synthesis scheme that makes use of Ephemeral History Registers (EHRs) shares some characteristics with conditional rules described above by providing control over scheduling and sequencing of rules that use the register. As is discussed further below, an EHR can help enable new scheduling capabilities that cannot be achieved using just SC and CF analysis.

Figure 1B:
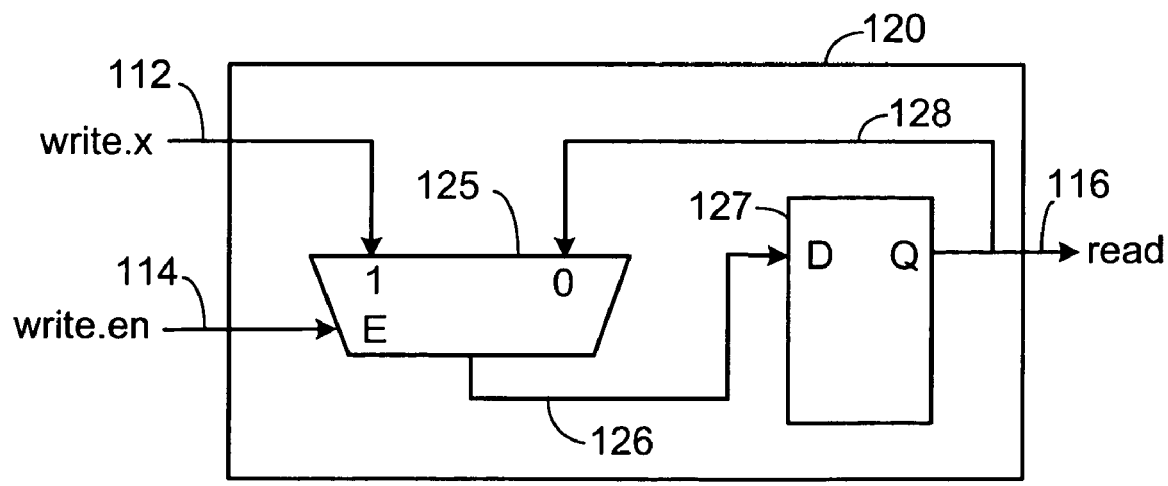
FIG. 1B is an implementation of a register.

Before describing an EHR, we first refer to FIG. 1A, in which a conventional register 110 has a write data (write.x) input 112 and a write enable (write.en) input 114, and an output (read) 116. On each clock cycle, the value of the output is updated to be the value presented at the input if the enable is asserted, and the output remains unchanged if the enable is not asserted. Referring to FIG. 1B, a module 120 which provides an implementation of a register 110 internally includes a register 127, which is always enabled to update its output based on its input on each clock cycle (i.e., register 127 does not have its own enable input). The output 128 of the register 127 is fed back to a selector 125. An enable input 114 controls whether the selector passes the write data input 112 or the fed back register output 128 to the input of register 127. That is, if the enable 114 is asserted, then the input 112 is passed to register 127 while if it is not asserted, the output of register 127 is fed back to its input.

An Ephemeral History Register (EHR) is a primitive state element that helps enable the forwarding of values from one rule to another. It is called Ephemeral History Register because it maintains (that is, there are signal paths that represent) a "history" of all writes that occur to the register within a clock cycle, in that each of the values that were written (the history) can be read through one of the read interfaces. However, the history is lost at the beginning of the next cycle.

Figure 2:
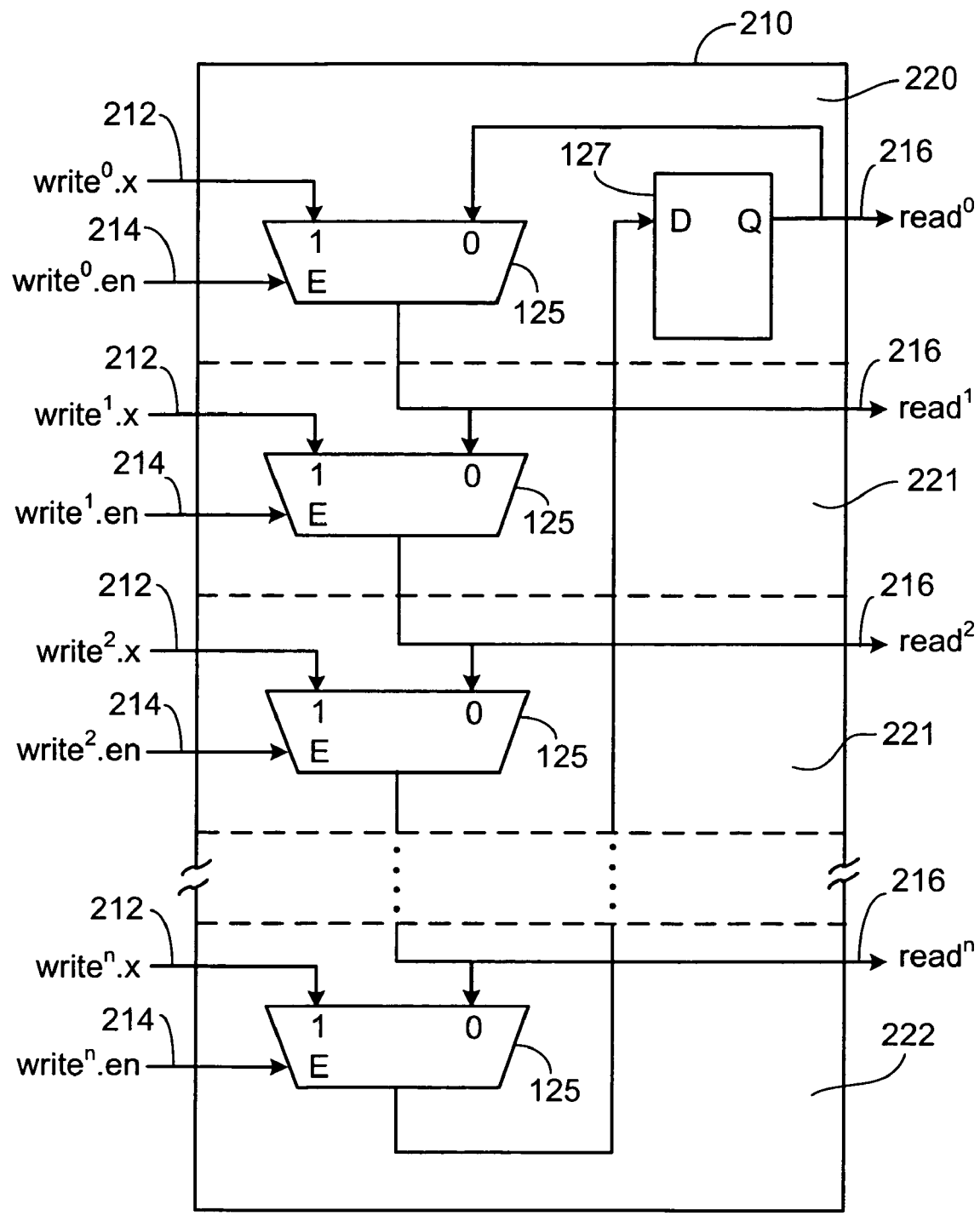
FIG. 2 is an implantation of an Ephemeral History Register (EHR).

Referring to FIG. 2, an EHR 210 includes multiple versions of each of the inputs and outputs corresponding to the register shown in FIG. 1B. We refer to the superscript index of a method (or equivalently of each input and output) as its version. For example, write² is version 2 of the write method. Each write method has two signals associated with it: x, the data input and en, the control input that indicates that the write method is being called (i.e., enabled). A value is not written unless the associated en signal is asserted.

The EHR 210 includes a number of components 220, 221, 222, each associated with a particular version of the methods for the corresponding module. A first component 220 has a structure similar to that of module 120 in FIG. 1B. A register 127 has a single input and a single output and is always enabled to be updated on the clock transition of the circuit. The output of the register 127 provides the read⁰ output 216 of the EHR. A selector 125 accepts write data write.x⁰ input 212 and the output of register 127 and outputs one of the inputs based on the write enable write.en⁰ input 214. The output of the selector is passed to the next component 221, while the input of the register 127 is accepted from the last component 222.

A series of zero or more intermediate components 221 each include a selector 125, which accepts the write data input 212 for the corresponding version and the output of the selector 125 of the previous component, and depending on the write enable input 214 for that version either passes the write data input 212 or the output of the previous selector.

A final component 222 includes a selector 125, as in the intermediate components 221, with the output of the selector being fed back to the input of the register 127 in the first component 220.

Note that if none of the write enable inputs write.en$^k$ (for k>0) are asserted, the EHR functions as the module 120 in FIG. 1B because when the write.en⁰ input is asserted, the write.x⁰ input passes through the first selector 125 as well as through each of the successive selectors 125 to the input of the register 127. That is, any component for which the enable input is not asserted has no functional effect on the operation of the EHR.

In an approach to circuit synthesis, the EHR is used in place of a standard primitive register element by first replacing calls to the register read and write methods with calls to the EHR read and write methods. As discussed above, these interfaces behave exactly as those of a normal register if none of the other interfaces are being used (i.e., if none of the other inputs are enabled).

An EHR can be used directly to exploit composed rules with conditional actions. Circuit synthesis using EHR does not generally require explicit generation of composite rules. Given the specification of a schedule the approach generates annotations on each method call and these annotations are further propagated inside modules to reach registers, which are then replaced by EHRs.

Figure 3:
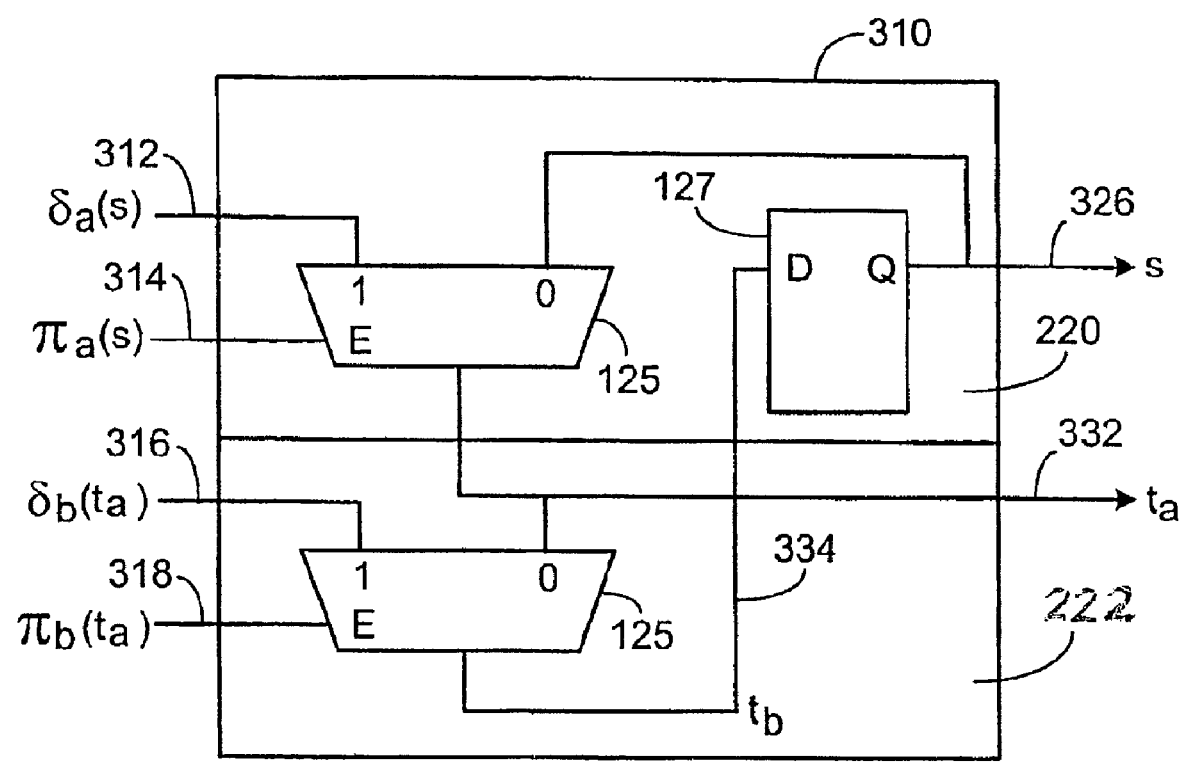
FIG. 3 is a synchronous circuit using an EHR.

Referring to FIG. 3, an EHR 310 can be used to synthesize a conditional rule of a form introduced above.

$R_{a,b}$: when (True) => $t_a$=if $\pi_a(s)$ then $\delta_a(s)$ else $s$; $t_b$=if $\pi_b(t_a)$ then $\delta_b(t_a)$ else $t_a$; $s:=t_b$ For sake of illustration, the state s is treated to be completely stored in a register 127 in the EHR 310; more generally, the EHR 310 only stores a portion of the state. The EHR 310 has two components, 220 and 222, each associated with one of the two rules ($R_a$ and $R_b$) that are conditionally composed. The first component 220 is enabled according to $\pi_a(s)$, where s is the state output 326 of the first component. When enabled, the state is updated according to the update function $\delta_a(s)$ 312 provided as an input to the first component, which also takes as an argument the output of the first component 220. Note that either s or $\delta_a(s)$, depending on whether $\pi_a(s)$ is true, is passed to the second component 222, where it is passed to the output of that component as $t_a$ 332. The second component 222 is associated with rule $R_b$. The second component 222 is enabled according to $\pi_b(t_a)$ where $t_a$ is the output 332 of the second component. When enabled, the state is updated according to the update function $\delta_b(t_a)$ provided as an input 316 to the second component, which also takes as an argument the output of the second component 222. The output of the selector 125 of the second component corresponds to the temporary variable $t_b$ 334, which is passed back to register 127, essentially implementing the final action, $s:=t_b$, of the conditional rule. Note that once the register accepts its input 334 and updates the output 326 at a clock transition, the temporary values 332 and 334 are "lost"—that is, they form the "ephemeral history" of the rule execution that is lost at the start of each clock cycle.

The effect of use of the EHR 310 as shown in FIG. 3 is as if rule $R_a$ executes (if enabled) in a first "sub-cycle"(or "phase") of an actual clocking cycle, and rule $R_b$ executes in a second later sub-cycle of the clocking cycle. Through the arrangement of the combinational (un-clocked) logic paths, the state update quantities computed in the first cycle form the outputs of the second cycle. The enable and state update computations for each sub-cycle take their inputs from outputs associated with the same sub-cycle. However, the sub-cycles do not have to be implemented using clocked logic with explicit or fixed durations for each sub-cycle. For example, different EHRs in a circuit, or one EHR at different states of the system can effectively consume different proportions of the overall clock cycle for the various sub-cycles used by the components of the EHRs.

Note that when rule $R_a$ is enabled, there is a combinatorial logic path from the output of register 127 (output s 326), through logic computing $\delta_a(s)$ 312, through the first selector 125 to the output $t_a$, and through logic computing $\pi_b(t_a)$ 318 and $\delta_b(t_a)$ 316, through the second selector 125, and then to the input of register 127. In considering whether it is advantageous to introduce a conditional rule of this type a designer and/or an automated procedure may consider the impact of the length of the logic path that winds through the multiple components of the EHR on the potential clocking speed of the resulting circuit. For example, if the path is too long, it may require a longer clock period than is desirable to allow signals to propagate through the length of the path.

An EHR can be used to implement a composition of a sequence of rules without introducing the composition into the asynchronous system specification. Suppose we are given rules $R_1$ and $R_2$ and want to achieve the effect of the composed rule $R_{1,2}$. EHRs can be used to satisfy the of such composition as follows:

1) Replace all registers accessed by $R_1$ and $R_2$ with EHRs.
2) Replace all read/write in $R_1$ by calls to read⁰/write⁰.
3) Replace all read/write in $R_2$ by calls to read¹/write¹.

Figure 4:
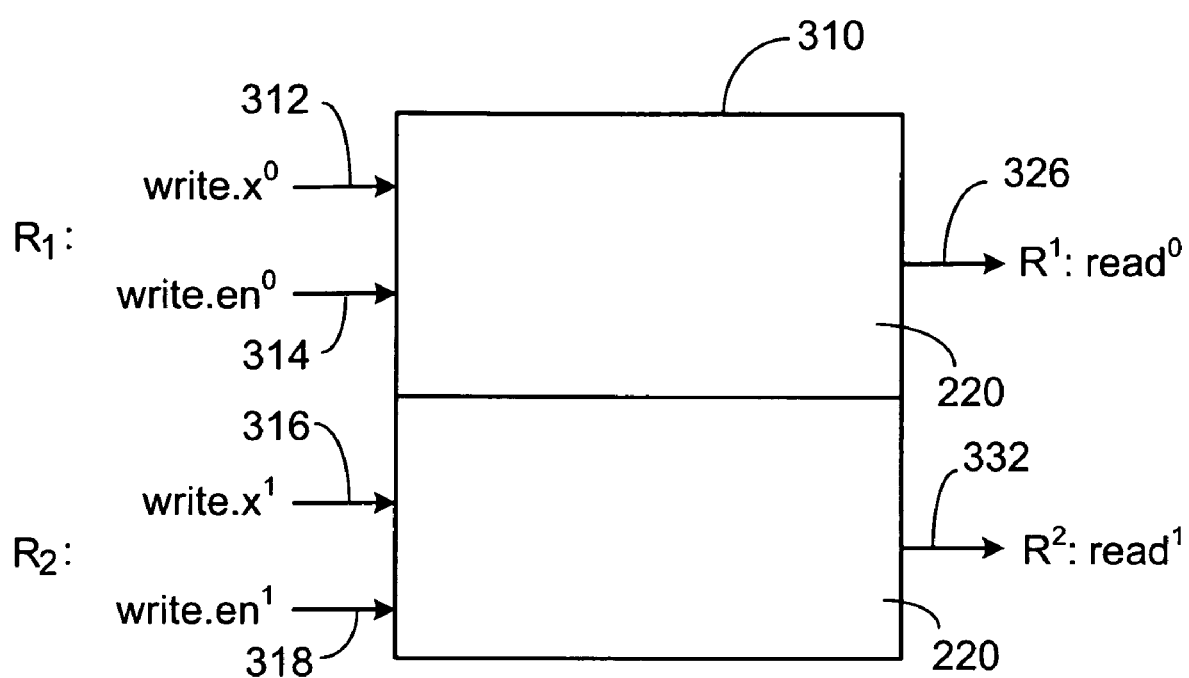
FIG. 4 is an EHR with two interface versions.

Referring to FIG. 4, the resulting EHR 310 (which has the same structure as illustrated in FIG. 3) has inputs assigned according to the above procedure. Each of the rules $R_1$' and $R_2$' execute individually as before. However, when executing together they exhibit the behavior of the composed rule $R_{1,2}$. What makes this possible is that the EHR circuit allows rule $R_2$' to observe the values that are written by $R_1$' earlier in the same clock cycle. When $R_1$' does not execute (write⁰.en is 0), and the EHR 310 returns the current state of the register to $R_2$' (read¹). However, when $R_1$' does execute and writes a value to the register (write⁰.en is 1), then the value that the $R_2$' read interface (read¹) returns is the value that was written by $R_1$' (write⁰.x).

This synthesis procedure, which is illustrated with two rules above, can be generalized to schedule a sequence of rules $R_0, R_1, R_2, R_3, \ldots R_n$ so that it appears as if the rules execute in the listed order. In many or almost all cases, the designer will also want all subsets of these rules to be composed in the same order. We can achieve this effect by replacing each rule $R_i$ in the sequence with a rule $R_i'$ in which all read and write method calls in $R_i$ by calls to $\text{read}^i$ and $\text{write}^i$ and by using a EHR with enough components. This procedure works for the same reasons that it works in the case of two rules— "later" rule in the composition order observes, via forwarding, any values that the next earliest rule writes.

Prior to synthesis of circuitry for an EHR (or as part of the synthesis procedure), an EHR introduced in the procedure above may be simplified if none of the interfaces at a particular version index are used. For example, suppose $R_3$, as part of a sequence $R_0, R_1, R_2, R_3$, is the only rule to access a register $\text{reg}_{only3}$. The algorithm turns $\text{reg}_{only3}$ into an EHR and provides $R_3$ access to it via interfaces $\text{read}^3$ and $\text{write}^3$. However, since none of the other rules access the version 0, 1, or 2 ports of the register $\text{reg}_{only3}$ it is wasteful to have $R_3$ tap the EHR at such a high version number. It could simply have accessed the register through the $\text{read}^0$ and $\text{write}^0$ interfaces. Thus, after each call to label the methods we should also call the PRUNE procedure which eliminates "gaps" in EHR references:

$P_{RUNE}(R_0, R_1, \ldots, R_n) =$
  1) access = { $\text{reg}_i$ | $\text{reg}_i$ is read or written in one of $R_0, \ldots, R_n$}
  2) for i = n downto 0 do
    foreach r ∈ access do
      if (r.read$^i$ and r.write$^i$ are unused) then
        decrement all access r.read$^j$ to r.read$^{j-1}$ for j > i
        decrement all access r.write$^j$ to r.write$^{j-1}$ for j > i The effect of assigning each of the rules $R_0, \ldots, R_n$ to a different version of the interfaces of the EHR can be viewed as having the rules scheduled during sequential unclocked temporal phases of a clock cycle, even though such phases are not implemented using clocked cycles that have shorter duration than the overall clocking cycle of circuit. Rules that are not part of a conditional composition $R_0, R_1, \ldots, R_n$ can be viewed as being executed during the zero$^{th}$ phase. Rule $R_1$ can be viewed as executing during the 1$^{st}$ additional phase, rule $R_2$ during the 2$^{nd}$ additional phase, and so forth. The EHR implementation provides the combinational logic that implements the effect of this conceptual view.

The approach described above for a particular sequence of rules to be composed can be extended to a scheduling sequence of sets of rules, $S_1, S_2, \ldots S_N$, where each $S_i$ represents a set of one or more rules. The approach enables execution one or more enabled rules in each set $S_i$ with the effect being that rules in a set $S_i$ see the effect of execution of the rules in sets $S_j$, for j<i.

Figure 7:
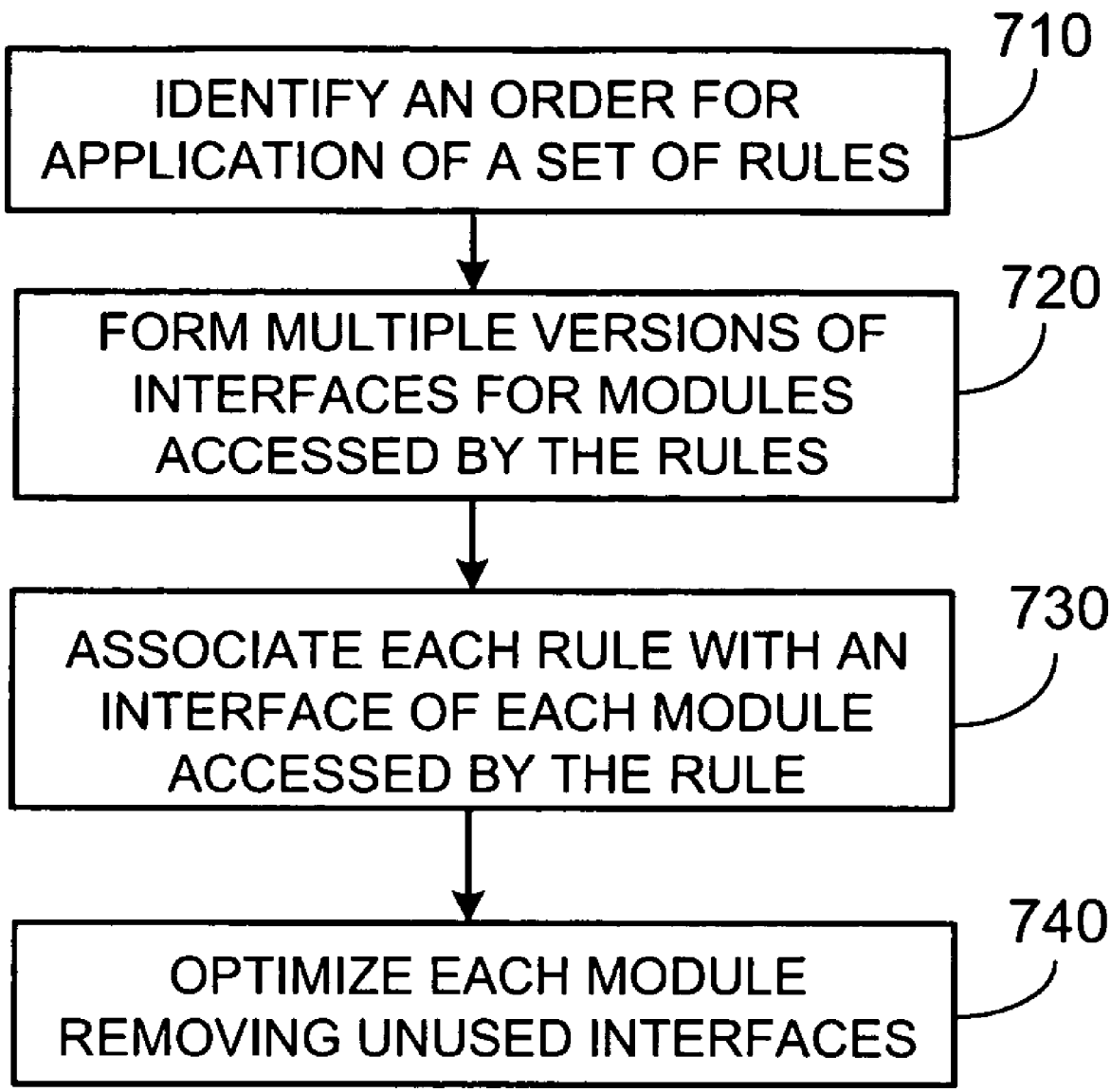
FIG. 7 is a flowchart illustrating a design approach.

An example of approach can be summarized with reference to the flowchart in FIG. 7. First, an order for the application of a set of rules is identified (step 710). For example, a designer manually specifies as sequential ordering of rules, or a partial ordering by identifying sects of rules that should be scheduled in sequence. In other examples, this identification of an ordering for rules may be the product of automated or semi-automated design tools, such as tools that take a functional or procedural specification for a system and produce a TRS specification.

Multiple versions of interfaces are formed for modules that are accessed by the rules (step 720). This step may be performed after step 710, for example, after having determined how many different interfaces are needed to support the sequencing of the rules. In other examples, modules with multiple interfaces (e.g., a fixed number of versions of its interface) may be predefined. In other examples, the first two steps are performed in one procedure, and additional version of interfaces are specified as needed by rules that are assigned to later phases of execution.

Each of the ordered rules is associated with a corresponding interface (step 730). In one example, the rules are indexed according their order, and the versions of the interfaces are similarly indexed according to their equivalent execution order, and rules and interfaces are matched according to their indices.

Finally, to address forming of modules with multiple versions of interfaces that may not in fact be associated with any rules, each of the modules is optimized to remove unused interfaces (step 740). This optimization may be performed at different stages of the design process. For example, the optimization may be performed as part of associating rules with interfaces by "promoting" rules to use lower index interfaces not used by other rules. In some examples, the optimization is implicitly performed by a logic optimization stage that removes logic that does not have specified inputs.

Given a set of rules $R_1, \ldots R_N$, all rules are scheduled by default in the zeroth phase. Call these rule instances $R_1^0, \ldots, R_N^0$, where the subscript indicates the phase in which the rule can be applied, and the version of the interfaces they use. A synthesized circuit makes use of a scheduler, for example, based on CF and SC analysis, to determine which enabled rules are executed in each clock cycle.

Suppose a designer wants to allow any subsequence of a single sequence of rules $R_1, \ldots, R_n$ to execute in a single cycle. Using the approach outlined above, this can be accomplished by introducing additional rules $R_2^1, \ldots, R_n^{n-1}$. (Note that $R_1^0$ is already available.) In this simple case only a single rule of the entire system is associated with each of the additional versions of the EHRs. Therefore, there can be no scheduling conflicts for the additional versions. The version one and higher rules are executed if they are enabled based on the state computed using their corresponding version of the interfaces.

Figure 5:
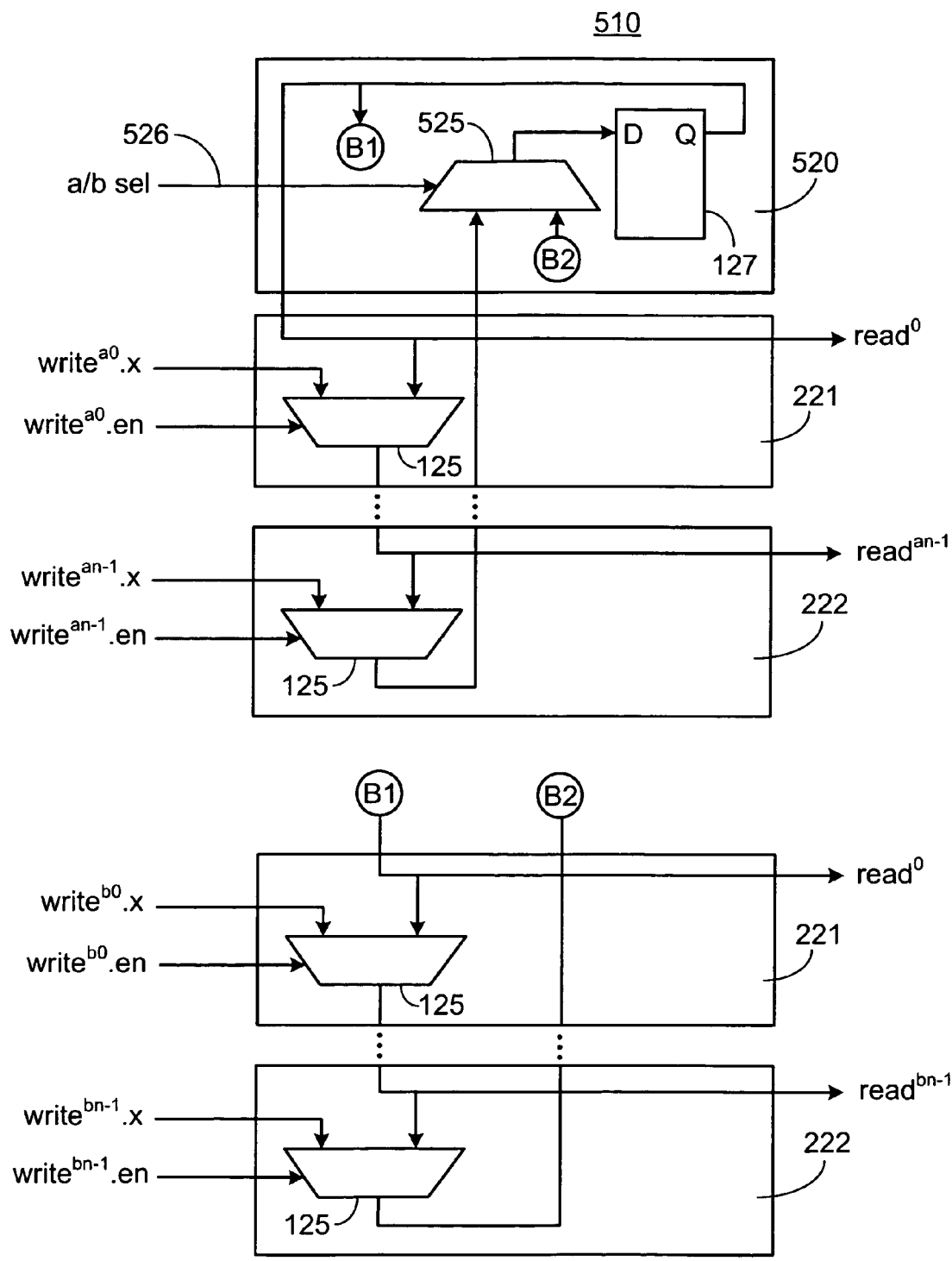
FIG. 5 is a split EHR.

Suppose a designer wants any subsequence of either a sequence of rules $R_{a1}, \ldots, R_{an}$ or a sequence of rules $R_{b1}, \ldots, R_{bn}$ to execute in a single cycle. One approach is to introduce a "split" EHR and associated scheduling logic that enables one sequence or the other but not both. Such a split EHR is shown in FIG. 5. A component 520, which includes a register 127 that holds the value of the EHR, is common to both sequences. A series of one or more components 221 followed by a component 222 is associated with each sequence of rules. Each of the series of components has a structure similar to the EHR 210 shown in FIG. 2. Component 520 includes a selector 525, which accepts the result of execution of rules in one but not both of the sequences. The selection input ("a/b sel") 526 is derived from the enable inputs of the individual rules, for example giving priority to the "a" sequence, if enabled, over the "b" sequence.

An alternative approach to allowing either of two sequences to execute is to add a sufficient number of stages to an EHR 210 to concatenate the two sequences of rules. It may be desirable to only allow at most one of the sequences to execute in order to limit the length of logic propagation paths. This can be accomplished by gating the enable input to each selector 125 with a selection input (e.g. a/b sel 526) for the corresponding sequence.

More generally, within any one phases, rules may be scheduled according to the previously developed techniques (e.g., according to CF, SC etc.). For example, consider a set of rules $R_1, \ldots, R_k$ that are assigned to a particular additional phase i and therefore access the version i interfaces of EHRs. If these rules are CF, then they can be enabled independently in the $i^{th}$ phase of execution. This is true in the degenerate case that there is only a single rule (k=1), and is true if the rules each access a different EHR. More generally, having assigned a set of rules to a particular additional phase i, a scheduler can be synthesized for those rules, for example, using CF and SC analysis. The scheduler can be independent of the rules assigned to different phases that are enabled, or as an option selection of enabled rules to execute could be dependent on the rules which are or would be enabled in other phases. That is, scheduling logic can be synthesized for each different version index of the EHRs, with the scheduling logic for a particular version index accepting its inputs from and enabling actions at the same version index.

Other generalizations of this approach can alternatively be used. For example, rules can be arranged in a direct acyclic graph or a tree structure, and subsets of rules along any path the graph can be enabled in this way.

Association of rules with additional phases can be done in various ways. For example, given an original set of rules $R_1^0, \ldots R_N^0$ (the zero superscript indicating the rules use the default zero index interfaces of the EHRs), copies of one or more of these rules can be added to use additional versions of the EHR interfaces. That is, a rule $R_i^k$ can be added to the $k^{th}$ version of the interfaces without introducing any new illegal behavior. Also, a rule $R_i^0$ can be "promoted" to form $R_i^k$ without retaining a copy associated with the zero index interfaces, and this promoting does not remove legal behavior of the system. Therefore, automatic compilation or specification of compiler inputs in general involves addition of rules to higher-index interfaces and/or reassigning the interface version for particular rules.

The approach described above in which rules in a sequence of rules can access different versions of interfaces of an EHR is also applicable to access multiple versions of interfaces to modules, which can be complex storage elements such as FIFOs or register files. For example, a FIFO module can have the following methods:

enqueue x—enqueues the value x when the FIFO is not already full dequeue—dequeues the first value in the FIFO when the FIFO is not empty first—returns the first value in the FIFO when the FIFO is not empty clear—empties the queue In a module, each method is associated with signals that indicate that the method can be called, for example, indicating whether the FIFO is not full so that the enqueue method can be called.

A module, such as a FIFO module, can be extended to have multiple EHR-like versions of interfaces. For example, a FIFO can be extended to have version zero interfaces, $enqueue^0$, $first^0$, etc., as well as version one interfaces $enqueue^1$, $first^1$, etc. If the FIFO is empty at the start of a clock cycle, then the $first^0$ method cannot be executed, even if the $enqueue^0$ method is called by a rule. However, the addition of the $first^1$ method provides a way of retrieving the value that is enqueued by the $enqueue^0$ method call. The $first^1$ method can be thought of as a "bypass" method that provides a value that has not yet reached the first entry in the queue. As an example of use of such a bypass method, by scheduling a sequence of rules $R_1$ and $R_2$ as rules $R_1^0$ and $R_2^1$ in using different versions of interfaces, if a rule $R_1^0$ calls the $enqueue^0$ method, and a rule $R_2^1$ calls the $first^1$ method, the $first^1$ method returns the value provided as an argument to the $enqueue^0$ method. Note that the implementation of the FIFO providing multiple interface versions does not necessary have to provide all methods at all interface indexes. For example, if rule $R_2$ is the only rule that accesses the first element of the FIFO and this rule is scheduled in the version one sub-cycle, then the FIFO only needs a $first^1$ interface and does not need a $first^0$ interface. Similarly, if no rule that enqueues data is scheduled in the index one sub-cycle, then the FIFO does not need to implement an $enqueue^1$ method.

An overall circuit synthesis approach using modules and multiple interface versions can therefore first generate circuitry that interfaces with different versions of module interfaces, and then once the required versions of the interfaces for a particular module are known, a multiple versioned instance of the module is synthesized for use in the overall circuit. For example, a generic instance of the module with all methods being available at all version indexes can be simplified, for example, by eliminating unused circuit paths related to versions of interface methods that are not used.

Figure 8:
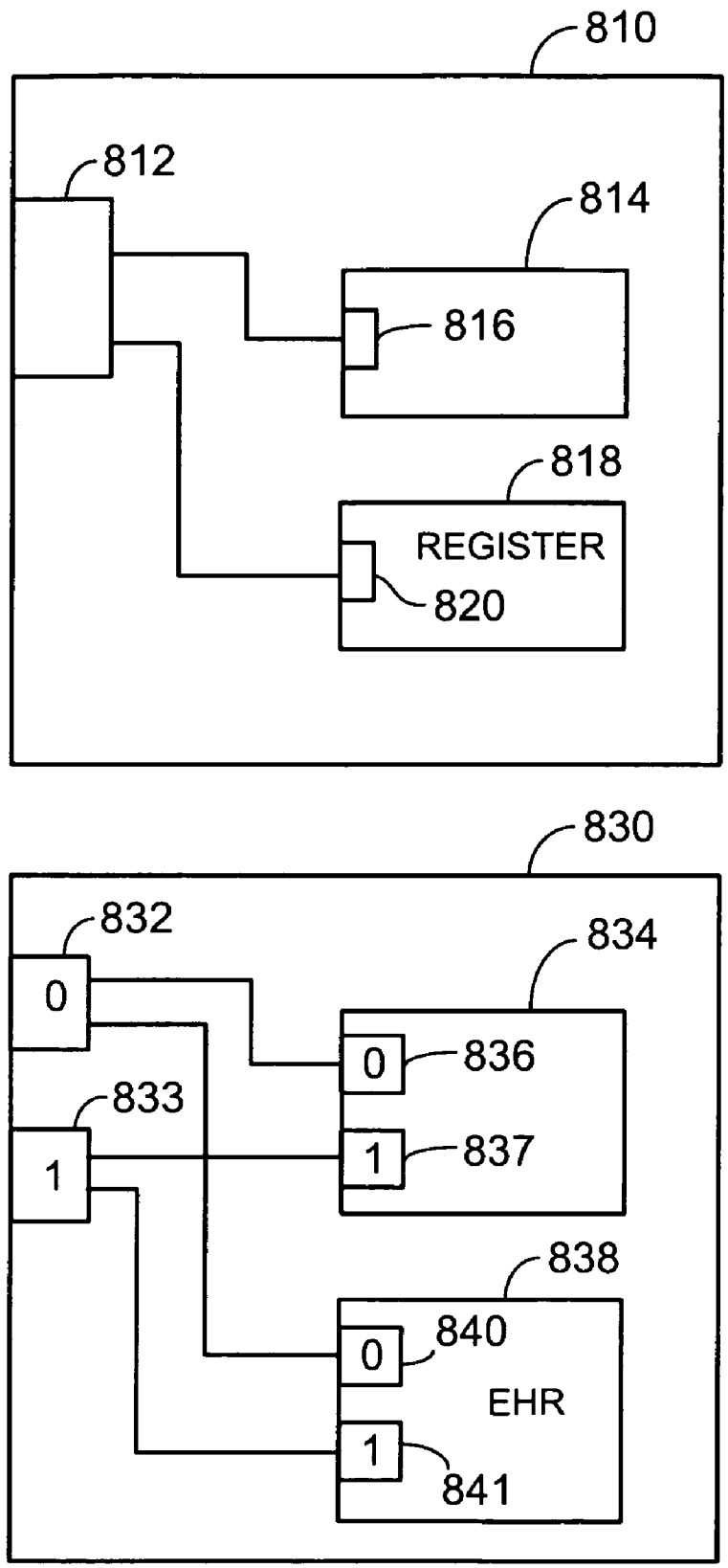
FIG. 8 is a module and a corresponding multiple interface version of the module.

FIG. 8 illustrates a process of synthesis of a module with multiple interfaces. Module 810 includes a single interface 812, and internally includes two sub-modules 814 and 818. The sub-modules have single interfaces 816 and 820, respectively. In this example, sub-module 818 is a register whose interface provides read, write.x (data) and write.en (enable) functions. Specification of module 830, which performs the function of module 810 but has two interfaces, 82 and 833, is performed recursively. That is, the synthesis process is applied to module 814 to form a multiple interface module 834 with interfaces 836 and 837. Sub-module 818, which is a register, is replaced with an EHR 838 with interfaces 840 and 841. Logic coupling interfaces 812, 816 and 820 in module 810 is replicated for each of the sets of new interfaces. That is, interfaces 832, 836 and 840 are linked by logic coupling them, and interfaces 833, 837 and 841 are coupled by another copy of that logic. The recursive approach terminates with components such as registers, for which multiple interface versions are pre-specified, for example as an EHR to replace a register.

Figure 6:
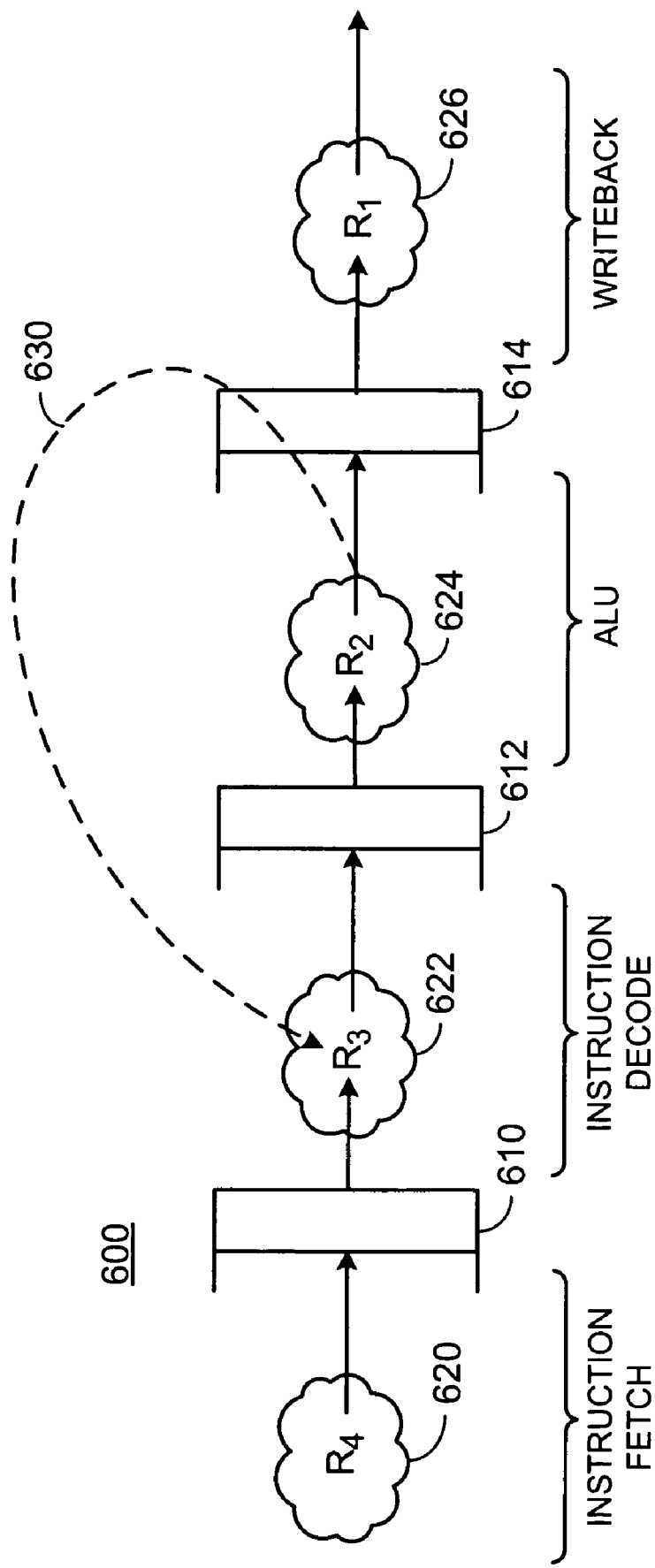
FIG. 6 is a schematic diagram of a multiple-state pipeline.

Referring to FIG. 6, an application of scheduling using multiple versions of interfaces is illustrated in the context of a multiple-stage pipeline system, which is illustrated as a cascade of processing stages separated by FIFOs 610, 612, 614. In this example, each of the FIFOs can hold at most one element. This example is motivated by a 4-stage pipeline processor in which the first processing stage 620 is associated with an instruction fetch function, a second stage 622 is associated with an instruction decode function, a third stage 624 is associated with an ALU (arithmetic logic unit) stage, and a fourth stage 626 is associated with a writeback function. For the sake of discussion, rules $R_1$ through $R_4$ are representative rules that are associated with each of the different stages. For example, rule $R_4$ enqueues data into FIFO 610. In order to do so, FIFO 610 cannot already have data stored in it. As an example of how conventional scheduling using CF analysis alone might function, consider a situation in which each of the FIFOs 610-614 have data stored in them. Because the FIFOs are all full, only $R_1$ is enabled—rules $R_2$-$R_4$ are not enabled because the destinations for the values they produce are not necessarily ready. If rule $R_1$ executes in the first clock cycle, FIFO 614 empties. This allows rule $R_2$ to execute on the next clock cycle—rules $R_3$ and $R_4$ are still blocked, and rule $R_1$ has no data to process. The result is that FIFOs 610 and 614 have data and FIFO 612 is now empty. On the next clock cycle, rules $R_1$ and $R_3$ can execute, and on the next clock cycle rules $R_2$ and $R_4$ can execute. This pattern of only executing half the stages at each clock cycle would continue.

Using the approach described above, enabling the sequence of rules $R_1, \ldots R_4$, to execute in a single clock cycle, yields a different result. Essentially, in the first sub-cycle, rule $R_1$ executes and empties FIFO 614. Similarly, in the second sub-cycle, rule $R_2$ executes emptying FIFO 612 and filling FIFO 614. In the third sub-cycle, rule $R_3$ executes, and in the fourth sub-cycle, rule $R_4$ executes. This results in all the stages being able to execute in a single clock cycle, as well as keeping all the FIFOs full at the end of the clock cycle.

In terms of length of combinatorial circuit paths and/or processing duration, the overall duration of the clock cycle does not have to allow for sequential processing of al the actions each of the processing stages (i.e., it is not in general necessary that clock duration must be greater than the sum of the durations needed to perform all the actions of each of the rules). For example, rule $R_2$ can be enabled as long as scheduling logic can determine that some other rule will empty the FIFO 614 in time. Rule $R_2$ will use the version index one interfaces of FIFO 614, and an empty$^1$ indicator will depend on whether a rule such as rule $R_1$ is scheduled to dequeue the FIFO 614 according to the version zero interface to the FIFO. Therefore, it is not necessarily that all the actions of rule $R_1$ have to be completed before processing any of the actions of rule $R_2$. Rather, it may be sufficient that that a signal path through the enable logic for rule $R_1$, through the logic that asserts the dequeue$^0$ signal to FIFO 614, then internally through the implementation of FIFO 614 to its full$^1$ interface, and finally from the full$^1$ output into the enable logic for rule $R_2$ has to have time to propagate.

In another aspect of scheduling rules $R_1$-$R_4$ to the applied sequentially in a single clock cycle, if rule $R_2$ generates a value that is to be queued into FIFO 614, that value can be made available to rule $R_3$ in a "bypass" of the FIFOs. If rule $R_2$ is scheduled to use the version one interfaces of FIFO 614, then a value enqueued by rule $R_2$ is available using the first$^2$ interface of FIFO 614. Rule $R_3$ is scheduled to use the version two interfaces of data elements and modules it accesses, and therefore if will have available to it the value to be enqueued in that clock cycle by rule $R_2$. This bypass-like data path is illustrated by the dashed line 630 in FIG. 6.

In architectures such as that shown in FIG. 6, a designer may identify specific sequences of rules (e.g., $R_1$-$R_4$) to execute in sequence within one close cycle. Alternatively, the designer may identify sets of rules associated with different stages of a pipeline architecture, and the circuit synthesis compiler may automatically identify the rules that should be enables in sequence. In another alternative, a circuit synthesis compiler automatically identifies the sets of rules based on a specification of the FIFOs that make up the pipeline.

Note that the same type of analysis may be used when a pipeline such as that shown in FIG. 6 has FIFOs with more than one entry. For example, the FIFOs may have two entries. In order to enable a super-scalar implementation, a designer may specify that a sequence have multiple instances of rules or sets of rules from each of the processing stages. For example, the designer may specify that a sequence $R_1, R_1, R_2, R_2, \ldots, R_4, R_4$ should be enabled in one clock cycle. In such an example, a FIFO may require four or more versions of its interfaces. However, the synthesis approach is similar.

In a related approach to scheduling with multiple sub-cycles and using modules, a module may have constraints on the interfaces available, for example, providing only certain of its interfaces at each version index. For example, a FIFO may provide first$^0$ and dequeue$^0$ at version index 0, enqueue$^1$ at the next version, and first$^2$ at the next version. In such an implementation, the first$^2$ interface can be used as a bypass output providing a value enqueued using the enqueue$^1$ interface. In such an approach, the association of rules in a sequence to particular versions of interfaces is not generally unconstrained. Rather, the synthesis compiler associates rules in a sequence with interface versions according to both the sequence identified by the designed and the availability of suitable interface versions of the modules accessed by the rules. For example, if a sequence of rules $R_1, R_2$ is such that rule $R_1$ enqueues into a FIFO of the type described above, and rule $R_2$ access the first element, then because the enqueue interface is not available at version index 0 but rather is available at version index 1, rule $R_1$ is "promoted" to that version index. Then because rule $R_2$ is to execute "after" $R_1$, it is assigned to the version two, and uses the first$^2$ interface. Other constrains imposed by the availability of interfaces and sequential timing (i.e., assignment to version indexes) of modules can also impose constraints on the sequential scheduling of rules.

Alternative versions of the system can be implemented in software, in firmware, in digital electronic circuitry, or in computer hardware, or in combinations of them. The system can include a computer program product tangibly embodied in a machine-readable storage device for execution by a programmable processor, and method steps can be performed by a programmable processor executing a program of instructions to perform functions by operating on input data and generating output. The system can be implemented in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks.

Additional examples are described in a thesis titled "A Performance Driven Approach for Hardware Synthesis of Guarded Atomic Actions," submitted by Daniel Rosenband to the Massachusetts Institute of Technology in August, 2005. This thesis is incorporated herein by reference.

It is to be understood that the foregoing description is intended to illustrate and not to limit the scope of the invention, which is defined by the scope of the appended claims. Many other implementations of the invention other than those described above are within the invention, which is defined by the following claims.

What is claimed is:

1. A method for designing a synchronous digital system comprising:
   using a computer to form a data representation of a synchronous digital system configured to schedule state transition rules for application, if enabled, in a single clocked cycle of the synchronous digital system to achieve a result equivalent to application of the rules in a predetermined order;

specifying modules with multiple successive interfaces such that within the single clocked cycle, each module is specified to perform a function equivalent to completing interactions through one of its interfaces before performing interactions through a succeeding one of its interfaces; and wherein using the computer to form the data representation further includes associating the scheduled state transition rules with corresponding interfaces of the modules; and wherein each of the multiple successive interfaces is associated with a corresponding different phase of an ordered set of processing phases of the single clocked cycle, and at least some input to an interface associated with one of the processing phases depends at least in part on an output of an interface associated with a previous processing phase.

2. The method of claim 1 wherein scheduling the state transition rules comprises identifying an ordering of the state transition rules.

3. The method of claim 2 wherein identifying the ordering includes identifying a sequence of sets of rules, and the predetermined order is such that any rule in one of the sets is applied prior to application of rules in the subsequent sets of rules in the sequence.

4. The method of claim 1 wherein specifying the modules comprises processing a specification of a first module having a single interface to a first function to form a specification of a second module having multiple successive interfaces, such that a second function of the second module is equivalent to completing the first function via one of its interfaces before performing the first function through any succeeding ones of its interfaces.

5. The method of claim 4 wherein processing the specification of the first module comprises recursively processing specifications of sub-modules of the first module to form specifications of sub-modules having multiple successive interfaces.

6. The method of claim 4 wherein the second module with multiple successive interfaces comprises an ephemeral history register (EHR).

7. The method of claim 1 wherein associating the state transition rules with corresponding interfaces, includes for each state transition rule associating that rule with one interface of each module.

8. The method of claim 1 further comprising optimizing the modules with multiple successive interfaces including removing interfaces that are not used by any rules.

9. The method of claim 1 wherein for at least one module an input to a second interface associated with a second of the processing phases depends on an output of a first interface associated with a first of the processing phases, the first processing phase being ordered prior to the second processing phase.

10. The method of claim 1 further comprising providing the data representation of the synchronous digital system for fabrication of circuitry implementing the synchronous digital system.

11. The method of claim 10 further comprising controlling fabrication of circuitry implementing the synchronous digital system according to the data representation of the synchronous digital system.

12. A method for using a computer to design a synchronous digital system according to an asynchronous system specification for a system comprising:

using the computer to form a data representation of a synchronous digital system, including;

accepting the asynchronous system specification at the computer, including accepting specifications of a plurality of state transition rules, each rule defining access to one or more storage elements of the system, using the computer to identify a sequence of the state transition rules for potential execution in a single cycle of the synchronous digital system, using the computer to associate each rule of the sequence of the state transition rules with a corresponding different phase of an ordered set of processing phases of the single cycle, wherein at least some input associated with one of the processing phases depends at least in part on an output associated with a previous processing phase, and processing using the computer asynchronous system specification and the specification of the sequence of rules to form the data representation of the synchronous digital system;

wherein the data representation of the synchronous digital system includes a representation of at least one storage element that provides multiple versions of interfaces, each version of the interfaces being associated with a different one of the sequence of state transition rules.

13. The method of claim 12 wherein the different versions of the interfaces are such that for a first version and a second version of the interfaces, states transitions associated with inputs at the first version of the interfaces affect outputs at the second version of the interfaces during a single cycle, and inputs at the second version of the interfaces do not affect outputs at the first version of the interfaces during a single cycle.

14. The method of claim 12 wherein the at least one storage element includes a register.

15. The method of claim 12 wherein the at least one storage element includes a first-in-first-out storage element.

16. A method for using a computer to design a synchronous digital system according to an asynchronous system specification for a system comprising:

using the computer to form a data representation of a synchronous digital system, including, accepting the asynchronous system specification at the computer, including accepting specifications of a plurality of state transition rules, each rule defining access to one or more storage elements of the system, using the computer to identify a sequence of the state transition rules for potential execution in a single cycle of the synchronous digital system, using the computer to associate each rule of the sequence of the state transition rules with a corresponding different phase of an ordered set of processing phases of the single cycle, wherein at least some input associated with one of the processing phases depends at least in part on an output associated with a previous processing phase, and processing using the computer asynchronous system specification and the specification of the sequence of rules to form the data representation of the synchronous digital system;

wherein the synchronous digital system represented by the formed data representation enables; asynchronous application of the series of state transition rules within a single cycle of the synchronous digital system.

17. The method of claim 16 wherein processing the asynchronous system specification and the specification of the sequence of rules includes associating different of said rules with different asynchronous sub-cycles of a cycle of the synchronous digital system.

18. A synchronous digital system comprising:
a module that includes an ordered set of multiple versions of an interface, the versions of the interface being associated with ordered processing phases of a clock cycle of the synchronous system;
circuitry for performing each of a plurality of actions, each action including an interaction with the module using a corresponding different one of the set of multiple versions of the interface;
wherein the module is configured to perform the plurality of actions in one clocked cycle such that a combined function is equivalent to sequential performance of the actions according to the ordering of the corresponding versions of the interface.

19. The system of claim 18 wherein at least some input to an interface associated with one of the processing phases depends at least in part on an output of an interface associated with a previous processing phase.

20. The system of claim 19 wherein for at least one module an input to a second interface associated with a second of the processing phases depends on an output of a first interface associated with a first of the processing phases, the first processing phase being ordered prior to the second processing phase.

21. A synchronous digital system comprising:
a plurality of storage elements, each storage element providing a set of interfaces for accessing or modifying a state of the storage element;
wherein at least a first of the storage elements includes multiple distinct versions of the set of interfaces, each version including some or all of the set of interfaces and including at least one input and one output of the storage element, each version of the interfaces being associated with a corresponding different one of a plurality of ordered sequential processing phases of a clocked cycle of the synchronous system such that the state of said storage element is responsive to inputs on multiple interfaces in a single clocked cycle.

22. The system of claim 21 wherein the versions of the interfaces for the first of the storage elements is such that for a first version and a second version of the versions of the interfaces, states transitions associated with inputs at the first version of the interfaces affect outputs at the second version of the interfaces during a single cycle of the synchronous digital system, and inputs at the second version of the interfaces do not affect outputs at the first version of the interfaces during a single cycle.

23. The system of claim 21 wherein the first of the storage elements comprises a first-in-first-out (FIFO) storage element, and wherein the multiple versions of interfaces of the element enable access to a value that is enqueued to the FIFO storage element using one version of the interfaces in a cycle of the synchronous digital system to be accessed in the same cycle through a different version of the interfaces.

24. The system of claim 21 wherein the first of the storage elements is implemented using asynchronous logic without requiring synchronous processing at a higher rate than that of the synchronous digital system.

25. The system of claim 21 wherein at least some input to an interface associated with one of the processing phases depends at least in part on an output of an interface associated with a previous processing phase.

26. The system of claim 25 wherein for at least one module an input to a second interface associated with a second of the processing phases depends on an output of a first interface associated with a first of the processing phases, the first processing phase being ordered prior to the second processing phase.

27. The system of claim 21 wherein each of multiple of the set of interfaces including a different output of the storage element.

28. The system of claim 27 wherein at least some of the different outputs of the storage elements are responsive to an input of an interface associated with a different processing phase than said output.

* * * * *